United States Patent
Lee et al.

(10) Patent No.: US 9,726,982 B2
(45) Date of Patent: Aug. 8, 2017

(54) MASKLESS EXPOSURE DEVICE AND METHOD FOR COMPENSATING CUMULATIVE ILLUMINATION USING THE SAME

(71) Applicant: SAMSUNG DISPLAY CO., LTD., Yongin-si, Gyeonggi-do (KR)

(72) Inventors: Hi-Kuk Lee, Yongin-si (KR); Jae-Young Jang, Suwon-si (KR); Jae-Hyuk Chang, Seongnam-si (KR); Sang-Don Jang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 29 days.

(21) Appl. No.: 14/831,830

(22) Filed: Aug. 20, 2015

(65) Prior Publication Data

US 2016/0109809 A1    Apr. 21, 2016

(30) Foreign Application Priority Data

Oct. 17, 2014  (KR) ........................ 10-2014-0140955

(51) Int. Cl.
*G03B 27/54* (2006.01)
*G03F 7/20* (2006.01)

(52) U.S. Cl.
CPC ...... *G03F 7/70275* (2013.01); *G03F 7/70291* (2013.01); *G03F 7/70358* (2013.01); *G03F 7/70558* (2013.01)

(58) Field of Classification Search
CPC ............. G03F 7/70083; G03F 7/70058; G03F 7/70508

USPC .................................. 355/52, 53, 55, 67–69
See application file for complete search history.

(56) References Cited

U.S. PATENT DOCUMENTS

| | | | |
|---|---|---|---|
| 6,373,619 B1* | 4/2002 | Sandstrom | B23K 26/032 359/254 |
| 2006/0033902 A1* | 2/2006 | Latypov | G03F 7/70291 355/67 |
| 2006/0092397 A1* | 5/2006 | Laan | G03F 7/70558 355/69 |
| 2007/0242246 A1* | 10/2007 | Gui | G03F 7/70275 355/53 |

FOREIGN PATENT DOCUMENTS

KR    10-2008-0053487 A    6/2008
KR    10-2011-0073938 A    6/2011
(Continued)

*Primary Examiner* — Hung Henry Nguyen
(74) *Attorney, Agent, or Firm* — Lewis Roca Rothgerber Christie LLP

(57) ABSTRACT

A maskless exposure device including a light source configured to emit an exposure beam, a light modulation element configured to modulate the exposure beam according to an exposure pattern, a projection optical system configured to transfer a modulated exposure beam to a substrate as a beam spot array, a beam measurement part configured to measure a beam data of the beam spot array, and a compensating mask generator configured to generate a compensating mask by utilizing a measured data of the exposure beam for compensating cumulative illumination, wherein the compensating mask generator is configured to turn off left and right beams of a first selected spot beam selected by the beam data, and then to turn off a second selected spot beam.

20 Claims, 8 Drawing Sheets

(56) References Cited

FOREIGN PATENT DOCUMENTS

| KR | 10-2011-0094807 A | 8/2011 |
|---|---|---|
| KR | 10-2012-0100208 A | 9/2012 |
| KR | 10-2015-0007369 A | 1/2015 |

\* cited by examiner

MASKLESS EXPOSURE DEVICE AND METHOD FOR COMPENSATING CUMULATIVE ILLUMINATION USING THE SAME

CROSS-REFERENCE TO RELATED APPLICATION

This application claims priority to and the benefit of Korean Patent Application No. 10-2014-0140955, filed on Oct. 17, 2014 in the Korean Intellectual Property Office KIPO, the content of which is herein incorporated by reference in its entirety.

BACKGROUND

1. Field

Aspects of exemplary embodiments of the present inventive concept relate to maskless exposure device and method for compensating cumulative illumination using the maskless exposure device.

2. Description of the Related Art

Generally, to form a metal pattern including a thin film transistor ("TFT") which is a switching element of a display substrate and signal lines, a metal layer and a photoresist layer are sequentially formed, and a mask corresponding to the metal pattern is disposed on the photoresist layer.

Then, a light is irradiated to an upper surface of the mask so that the photoresist layer is exposed and developed. Thus, the photoresist pattern corresponding to the mask is formed. The metal layer is etched to form the metal pattern. When the metal layer is etched, the photoresist pattern functions as an etch stopping layer.

The display substrate has a plurality of metal patterns having different shapes from each other. Therefore, a plurality of masks corresponding to the number of the metal patterns may be required. In addition, when the shape of the metal pattern is changed, the shape of the mask has to be changed correspondingly, so a new mask has to be fabricated. The fabrication cost of the mask is relatively high, thus, the manufacturing cost of the display substrate may increase.

To solve the above mentioned problems, a maskless exposure device providing a plurality of beams to a substrate without the mask has been used. In the maskless exposure device, the beams are independently turned on or off so that the beams are selectively provided to the substrate. Thus, a desired photoresist pattern may be formed on the substrate.

However, each beam has a different optical character, such as a size of beam, a position of beam and an intensity of beam. Thus, a wiring may be formed having a non-uniform shape. Accordingly, defects may occur including display panel stain.

SUMMARY

Aspects of exemplary embodiments of the present inventive concept are directed toward a maskless exposure device capable of decreasing defects on a display panel.

Aspects of exemplary embodiments of the present inventive concept are further directed to a method for compensating cumulative illumination using the maskless exposure device.

According to one or more exemplary embodiments of the present inventive concept, there is provided a maskless exposure device including: a light source configured to emit an exposure beam; a light modulation element configured to modulate the exposure beam according to an exposure pattern; a projection optical system configured to transfer a modulated exposure beam to a substrate as a beam spot array; a beam measurement part configured to measure a beam data of the beam spot array; and a compensating mask generator configured to generate a compensating mask by utilizing a measured data of the exposure beam for compensating cumulative illumination, wherein the compensating mask generator is configured to turn off left and right beams of a first selected spot beam selected by the beam data, and then to turn off a second selected spot beam.

In an embodiment, after left and right beams of the first selected spot beam are turned off, the first selected spot beam is excluded as selection targets.

In an embodiment, the beam data includes data associated with position, intensity, horizontal size, and vertical size of spot beams constituting the beam spot array.

In an embodiment, the first selected spot beam and the second selected spot beam are selected as points having first and second highest space densities, respectively.

In an embodiment, a space density is defined by:

$$\frac{1}{d1^2 + d2^2 + d3^2 + d4^2},$$

and each of the d1, d2, d3 and d4 represents a distance from a reference spot beam to another spot beam within a gaussian range of the reference spot beam.

In an embodiment, the compensating mask generator is further configured to accrue intensity of the spot beams discretized with respect to all fields of the projection optical system, and to perform a digital compensation with respect to the accrued intensity of the spot beams.

In an embodiment, the compensating mask generator is configured to generate a compensating mask by calculating a residual with respect to a position event generator (PEG) of Y-coordinate of the spot beams.

In an embodiment, the maskless exposure device further includes: a controller configured to transmit a corrected exposure pattern corrected by the compensating mask to the light modulation element.

In an embodiment, the maskless exposure device further includes: an exposure data generator configured to generate exposure data of the light modulation element according to the exposure pattern.

In an embodiment, the controller is further configured to perform a logic AND operation of the compensating mask and the exposure data to form the corrected exposure pattern corrected by the compensating mask.

According to one or more exemplary embodiments of the present inventive concept, there is provided a method for compensating cumulative illumination utilizing a maskless exposure device, the method including: transmitting light from a light source to a substrate through a light modulation element and a projection optical system as a beam spot array; measuring beam data of the beam spot array; and generating a compensating mask based on the measured beam data by turning off left and right beams of a first selected spot beam selected based on the beam data, and then turning off a second selected spot beam.

In an embodiment, the generating the compensating mask further includes excluding the first selected spot beam after the left and right beams of the first selected spot beam are turned off.

In an embodiment, the beam data includes data associated with position, intensity, horizontal size, and vertical size of each of the spot beams constituting the beam spot array.

In an embodiment, the first selected spot beam and the second selected spot beam are selected as points having first and second highest space densities, respectively.

In an embodiment, a space density is defined by:

$$\frac{1}{d1^2 + d2^2 + d3^2 + d4^2},$$

and each of the d1, d2, d3 and d4 represents a distance from a reference spot beam to another spot beam within a gaussian range of the reference spot beam.

In an embodiment, the generating the compensating mask further includes accruing intensity of the spot beams discretized with respect to all fields of the projection optical system, and performing a digital compensation with respect to the accrued intensity of the spot beams.

In an embodiment, the generating the compensating mask further includes calculating a residual with respect to a position event generator output of Y-coordinate of the spot beams.

In an embodiment, the method further includes: transmitting a corrected exposure pattern corrected by the compensating mask to the light modulation element.

In an embodiment, the method further includes: generating exposure data of the light modulation element according to the exposure pattern.

In an embodiment, the method further includes: performing a logic AND operation of the compensating mask and the exposure data to form the corrected exposure pattern corrected by the compensating mask.

According to the present exemplary embodiment, the maskless exposure device compensates the cumulative illumination in software. Therefore, degradation of the LER may be prevented and the maskless exposure device may provide a regular (e.g., non-distorted) cumulative illumination.

BRIEF DESCRIPTION OF THE DRAWINGS

The above and other aspects and features of the present inventive concept will become more apparent by describing in detail exemplary embodiments thereof with reference to the accompanying drawings, in which.

DETAILED DESCRIPTION

Hereinafter, the present invention will be explained in detail with reference to the accompanying drawings.

Figure 1:
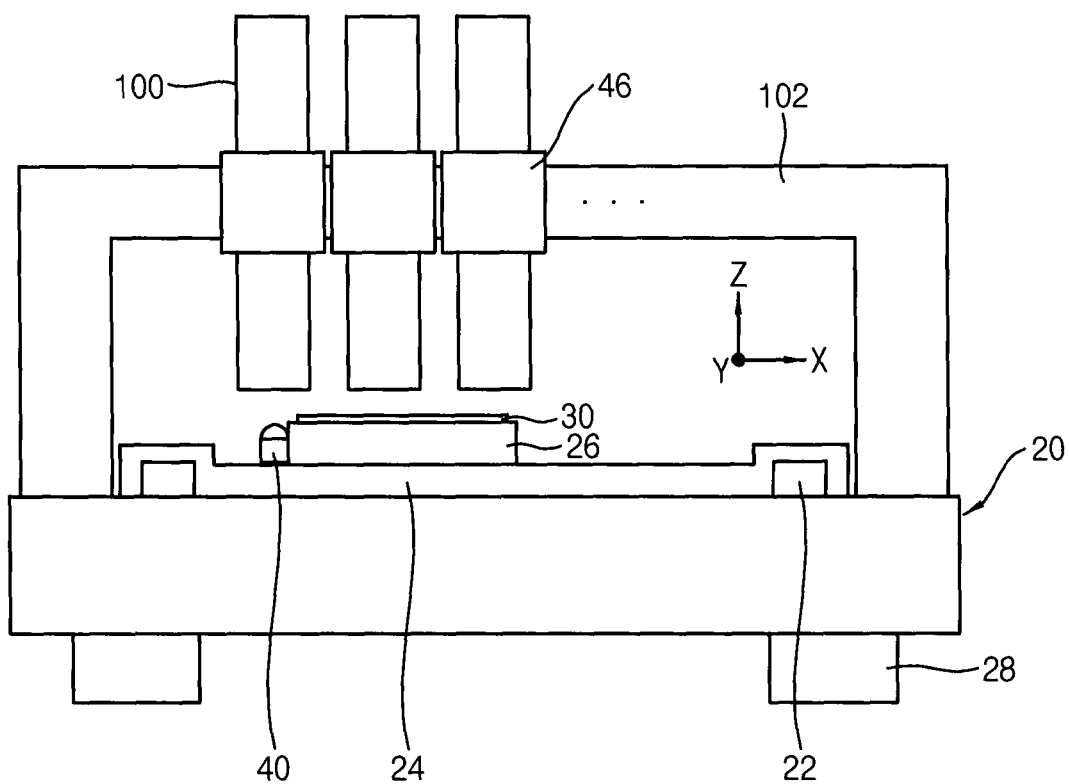
FIG. 1 is a block diagram illustrating a maskless exposure device according to an exemplary embodiment of the present inventive concept.

FIG. 1 is a block diagram illustrating a maskless exposure device according to an exemplary embodiment of the present inventive concept.

Referring to FIG. 1, a maskless exposure device 10, according to an exemplary embodiment of the present inventive concept, includes a stage 20 and an exposure head 100. The stage 20 transfers a substrate 30. The exposure head 100 irradiates an exposure beam on to the substrate 30 to expose a photosensitive material coated on the substrate 30.

The stage 20 may transfer the substrate 30 in an x-coordinate direction, a y-coordinate direction, and a z-coordinate direction. Guides 22 and 24 disposed on the stage 20 may guide the stage 20. Thus, the stage 20 may move in the x-coordinate direction and the y-coordinate direction.

In addition, the stage 20 may include a chuck 26 fixing the substrate 30 on the stage 20 and an isolator 28 reducing a vibration of the stage 20.

The exposure head 100 is mounted on a gantry 102, and thus irradiates an exposure beam on to the substrate 30 to expose a photosensitive material coated on the substrate 30. The exposure head 100 may be a single head or a multi-head.

In the present exemplary embodiment, the stage 20 on which the substrate 30 is fixed (e.g., is stationary) moves with respect to the exposure head 100. However, the present inventive concept is not limited thereto. For example, the stage 20 is fixed, and the exposure head 100 may move with respect to the stage 20. In addition, the stage 20 and the exposure head 100 may both be non-stationary and move with respect to each other.

In addition, the maskless exposure device 10 includes a beam measurement part (beam measuring part) 40. The beam measurement part 40 measures a position of the exposure beam irradiated from the exposure head 100 onto the substrate 30.

Figure 2:
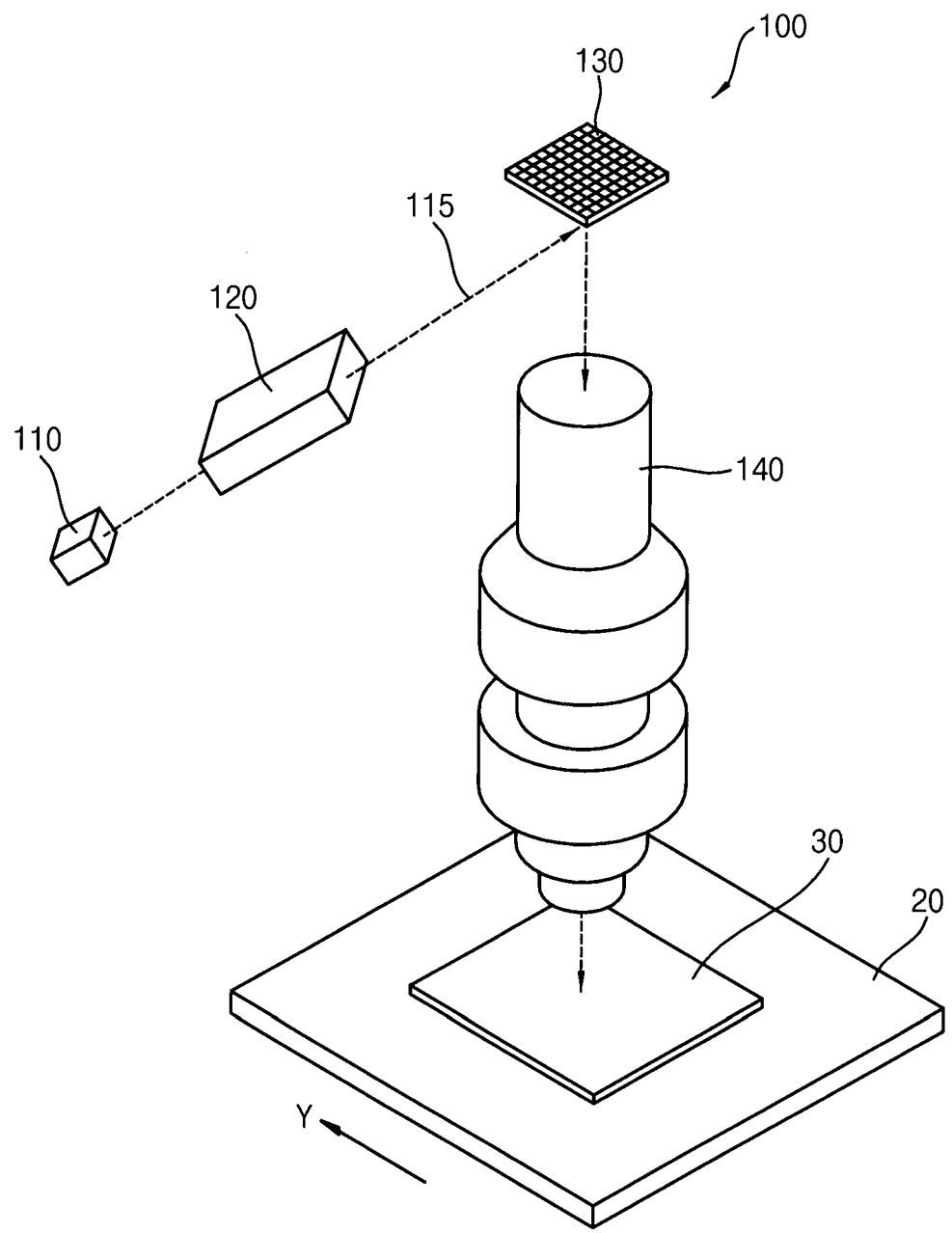
FIG. 2 a perspective view illustrating an exposure head according to an exemplary embodiment of the present inventive concept.
Figure 3:
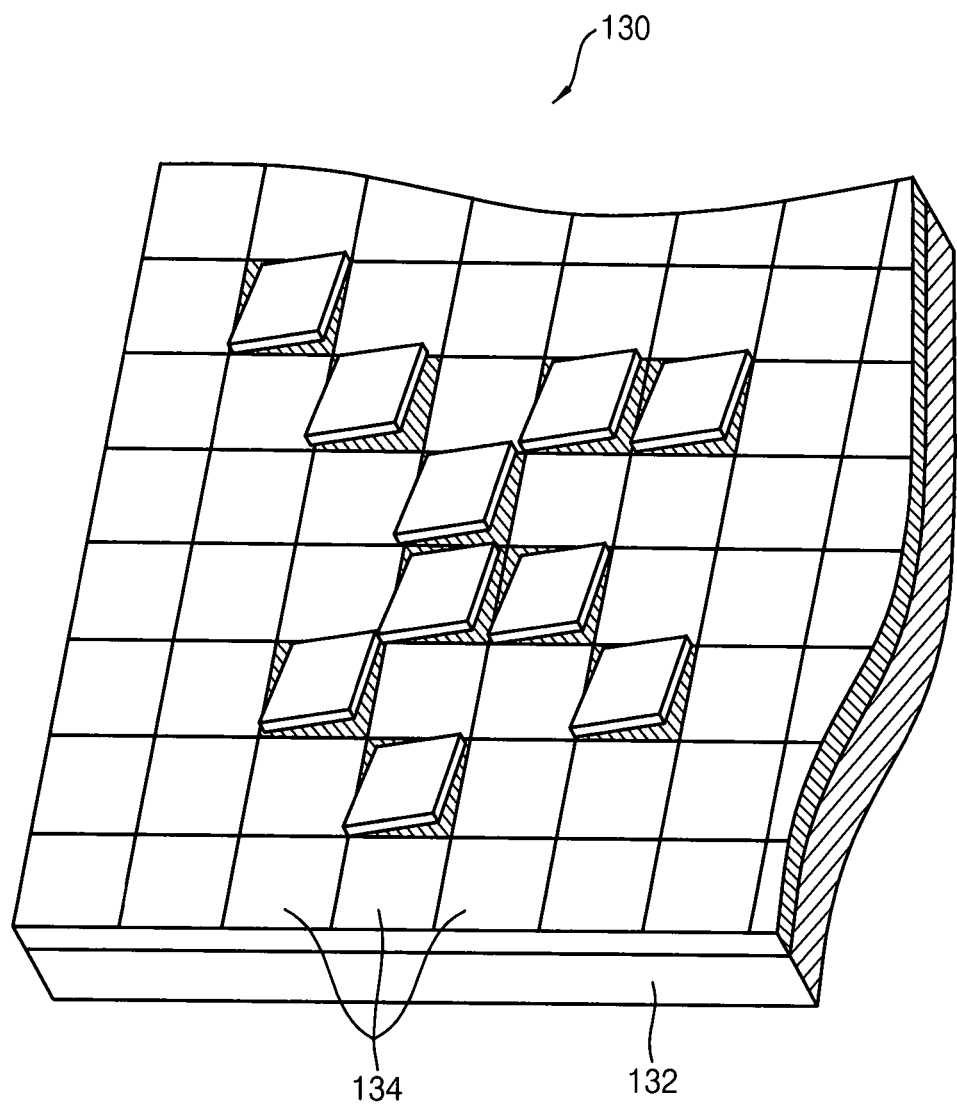
FIG. 3 is a perspective view illustrating a digital micro-mirror device ("DMD") of a maskless exposure device according to an exemplary embodiment of the present inventive concept.

FIG. 2 is a perspective view illustrating an exposure head according to an exemplary embodiment of the present inventive concept. FIG. 3 is a perspective view illustrating a digital micro-mirror device ("DMD") of a maskless exposure device according to an exemplary embodiment of the present inventive concept.

Referring to FIGS. 2 and 3, the exposure head 100 includes a light source 110 to emit an exposure beam 115; an illumination optical system 120 to correct or adjust an exposure beam 115 emitted from a light source 110, so as to provide uniform illumination, and then to emit the corrected exposure beam 115; a light modulation element (e.g., optical modulation element) 130 to modulate the exposure beam 115 emitted from the illumination optical system 120 according to pattern data (image data); and a projection optical system 140 to transmit the exposure beam 115 modulated by the light modulation element 130 to the substrate 30 as a beam spot array.

The light source 110 emits the exposure beam 115, and includes a semiconductor laser or an ultraviolet lamp. The exposure beam 115 is emitted from the light source 110 and is transferred onto the substrate 30 through the light modulation element 130 and the projection optical system 140.

The light modulation element 130 includes a spatial light modulator (SLM).

For example, the light modulation element 130 may be a micro electro mechanical system (MEMS) type (kind) digital micro mirror device (DMD), a two-dimensional grating light valve (GLV), an electric optical element using lead zirconate titantate (PLZT) which is a light-transmitting ceramic, and a Ferroelectric Liquid Crystal (FLC). Among these, a DMD may be used as the light modulation element 130. Hereinafter, for convenience of description, the light modulation element 130 including the DMD will be described.

As shown in FIG. 3, a DMD of a maskless exposure device, according to an exemplary embodiment of the present inventive concept, includes a memory cell 132 and a plurality of micro-mirrors 134 arranged in a matrix (e.g., arranged as a matrix type) of L rows and M columns. An angle of the micro-mirror 134 is controlled according to a control signal generated based on an image data. Accordingly, a desired light is reflected to be transferred to the projection optical device, and other light (e.g., undesired light) is reflected by a different angle to be, in effect, blocked.

When a digital signal is inputted to the memory cell 132 of the DMD, the micro-mirror 134 is tilted at a certain angle based on a diagonal within a certain angle range (for example, ±12°). A light reflected by the micro-mirror 134 of "on" condition exposes a photoresist on a substrate, and a light reflected by the micro-mirror 134 of "off" condition does not expose the photoresist on a substrate (e.g., is diverted away from the photoresist on the substrate).

Figure 4:
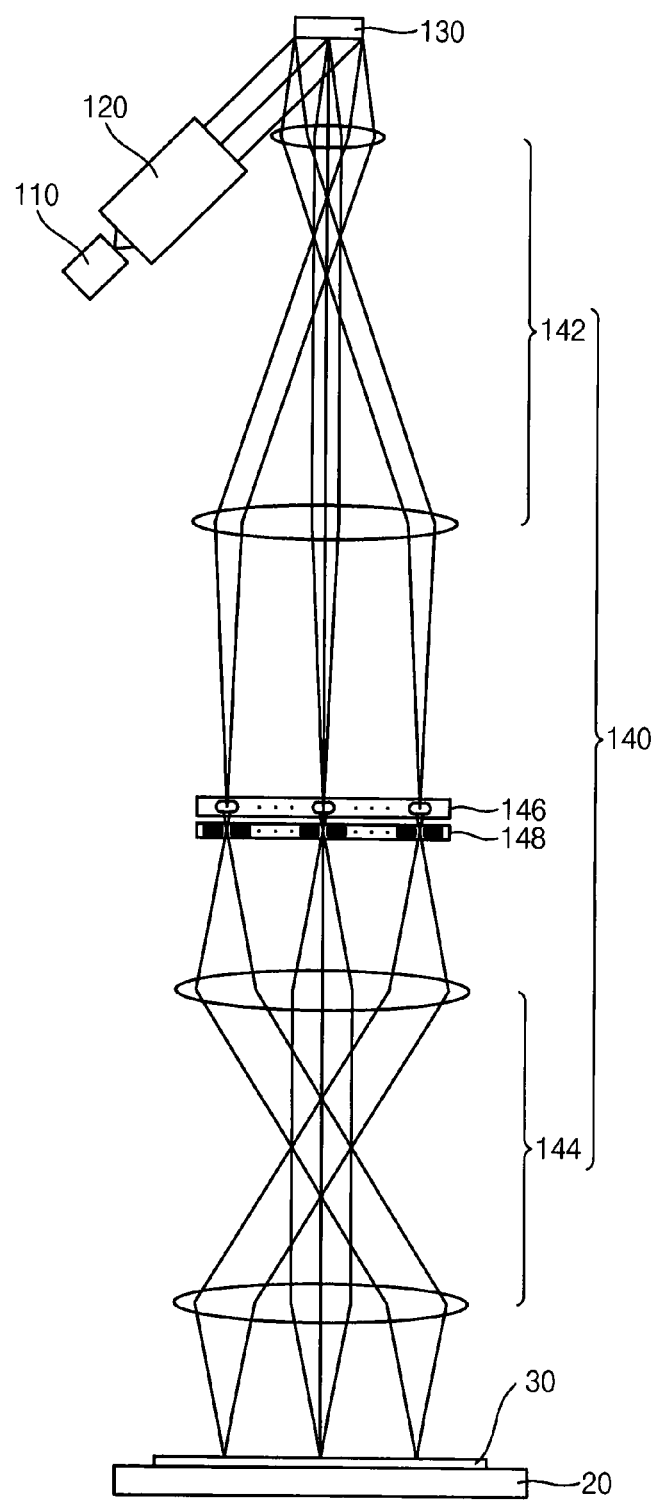
FIG. 4 is a side view illustrating an exposure head according to an exemplary embodiment of the present inventive concept.

FIG. 4 is a side view illustrating an exposure head according to an exemplary embodiment of the present inventive concept.

Referring to FIG. 4, the projection optical system 140 includes a first imaging optical system 142, a second imaging optical system 144, a micro lens array 146, and an aperture array 148 along a route through which the exposure beam 115 passes.

The first imaging optical system 142 is a double telecentric optical system. The first imaging optical system 142 magnifies (e.g., by about 4×) an image having passed through the light modulation element 130, and then forms the magnified image on an aperture plane of the micro lens array 146.

The second imaging optical system 144 is also a double telecentric optical system. The second imaging optical system 144 forms a plurality of beam spots (or spot beams), formed on a focal plane of the micro lens array 146, on the substrate 30 with a predetermined/desired magnification (for example, about 1×). Although this example embodiment discloses magnifications of the first imaging optical system 142 and the second imaging optical system 144 as being 4× and 1×, respectively, example embodiments are not limited thereto For example, an optimum or desired combination of the magnifications may be deduced according to a desired size of the beam spots, the minimum feature size of a pattern to be exposed, and/or the number of the exposure heads 100 used in the maskless exposure device 100.

The micro lens array 146 is formed by two-dimensionally arranging a plurality of micro lenses corresponding to the micro-mirrors 134 of the light modulation element 130. For example, if the light modulation element 130 includes 1920×400 micro-mirrors 134, 1920×400 microlenses are correspondingly arranged. Further, an arrangement pitch of the microlenses may be substantially equal to a value obtained by multiplying an arrangement pitch of the micro-mirrors 134 of the light modulation element 130 by the magnification of the first imaging optical system 142.

The aperture array 148 is formed by two-dimensionally arranging a plurality of pin holes corresponding to the micro lenses on the focal plane of the micro lens array 146. The pin holes standardize the beam spots focused by the micro lenses to a designated/desired size and/or block noise generated by the projection optical system 140. For example, the pin holes have a diameter of about 6 μm.

Figure 5:
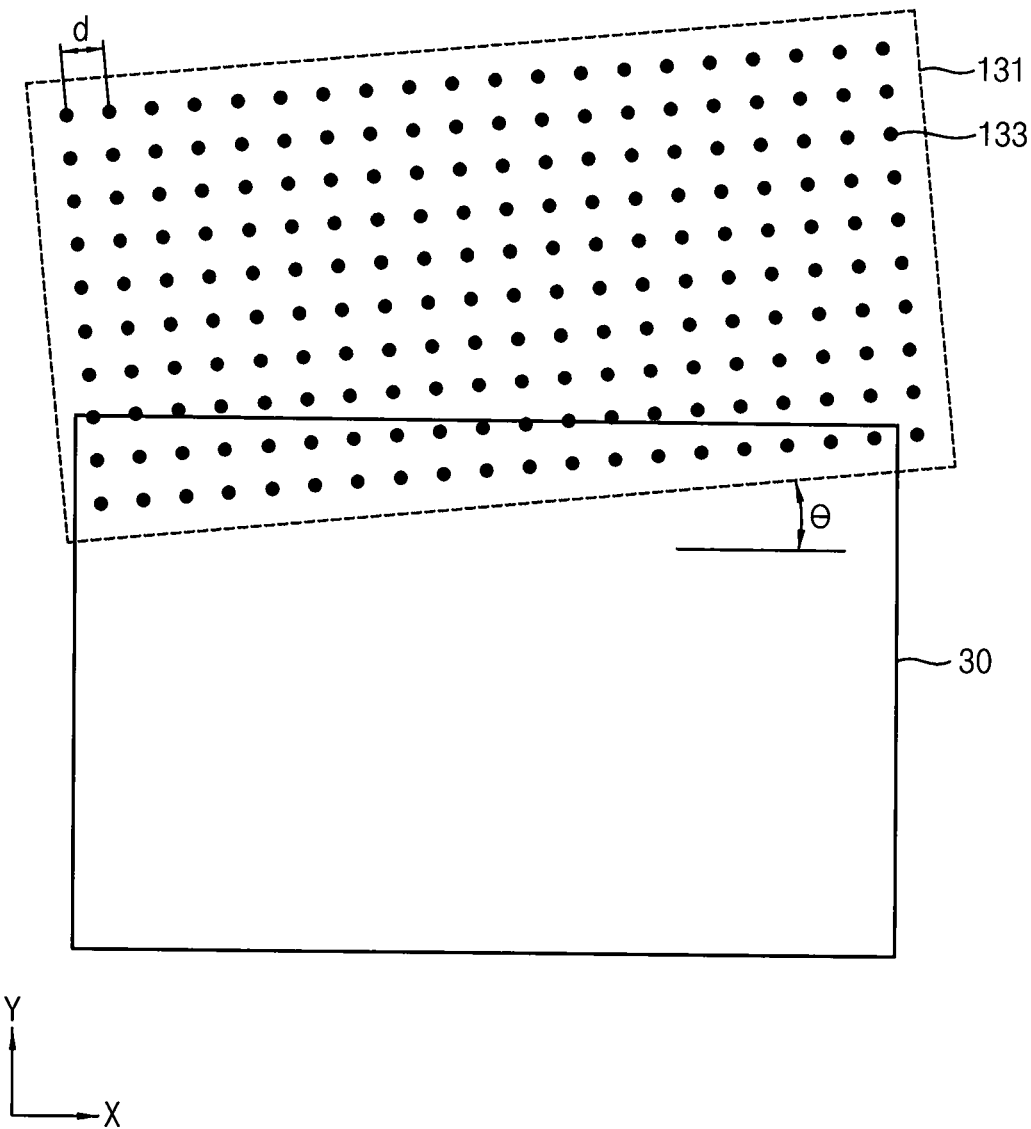
FIG. 5 is a plan view illustrating a beam spot array according to an exemplary embodiment of the present inventive concept.

FIG. 5 is a plan view illustrating a beam spot array according to an exemplary embodiment of the present inventive concept.

Referring to FIG. 5, the exposure beam 115 focused on the focal plane of the micro lens array 146 from the light modulation element 130 via the first imaging optical system 142 has a circular or oval shape. Thereafter, the exposure beam 115 is focused on the substrate 30 via the second imaging optical system 144, thereby forming a beam spot array 131. The beam spot array 131 includes a plurality of beam spots (or spot beams) 133 arranged in a matrix. For example, an arrangement pitch (e.g., distance d) of the beam spots 133 is about 55 μm, and the beam spots 133 having a circular shape are arranged in a gaussian distribution, a full width at half maximum (FWHM) of which is about 2.5 μm.

An arrangement direction of the beam spot array 131 is tilted at a designated/desired arrangement angle θ with respect to a scanning direction (for example, a x-coordinate direction). It functions to increase resolution of the maskless exposure device 100.

As explained above, the exposure beam 115 is emitted from the light source 110 and is transferred onto the substrate via the light modulation element 130 and the projection optical system 140. Thus, when an exposure image is distorted due to a distortion of the projection optical system 140, a cumulative illumination may be irregular (e.g., distorted). Accordingly, quality of an exposure may be deteriorated.

In the case of a maskless exposure device, a position and illumination of the beam spots 133 is measured to provide the light modulation element 130 with a kind of mask. Accordingly, although the projection optical system experiences a distortion, a cumulative illumination may be regular (e.g., non-distorted). However, when a mirror of the light modulation element 130 is operated arbitrarily, lattice characteristics of the beam spots may be destroyed. Accordingly, line edge roughness (LER) may occur.

Therefore, hereinafter, an exposure method capable of preventing (or protecting) LER from occurring and capable of providing a regular cumulative illumination will be described.

Figure 6:
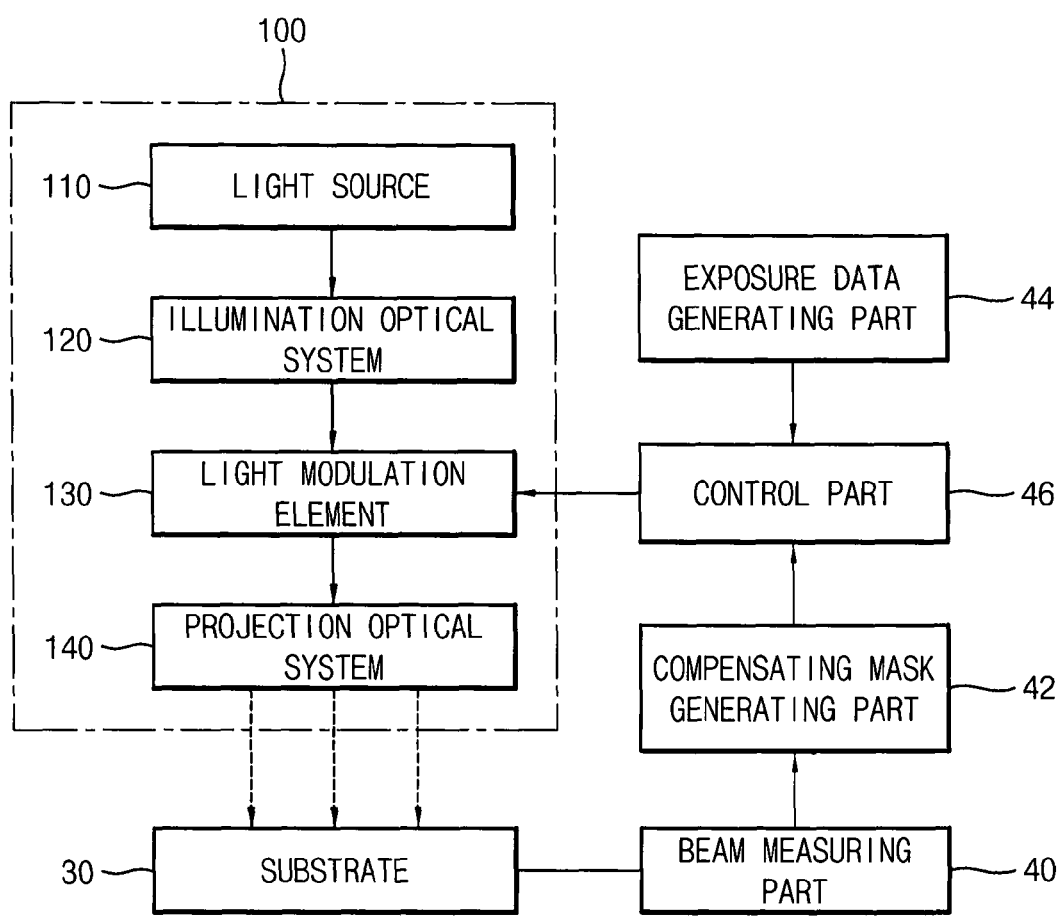
FIG. 6 is a block diagram illustrating a maskless exposure device according to an exemplary embodiment of the present inventive concept.

FIG. 6 is a block diagram illustrating a maskless exposure device according to an exemplary embodiment of the present inventive concept.

Referring to FIG. 6, a maskless exposure device 10 according to an exemplary embodiment of the present inventive concept includes a beam measurement part 40, a compensating mask generator (a compensating mask generating part) 42, an exposure data generator (an exposure data generating part) 44, and a controller (control part) 46.

The beam measurement part 40 measures a position, an intensity, a size of horizontal direction, and a size of vertical direction of the beam spots 133 arranged as a matrix (e.g., matrix type) in the beam spot array 131.

The compensating mask generator 42 generates a compensating mask for securing a regular cumulative illumination by using a beam intensity data and a beam size data (e.g., along a horizontal direction and a vertical direction) in software, firmware, hardware, etc. At this time, the data used for generating the compensating mask may be data measured with respect to all the beam spots or data measured with respect to a portion of the beam spots.

When the compensating mask generator 42 generates a compensating mask in software, firmware, hardware, etc., it is desired to avoid degradation of the LER.

Therefore, the compensating mask generator 42 generates a compensating mask using the following processes.

In order to compensate an irregularity (e.g., distortion) of cumulative illumination, after characteristics of the beam spots 133 (e.g., position, intensity, size along the horizontal direction and size along the vertical direction) is measured, the measured characteristics of the beam spots 133 is stored as data.

Thereafter, the data is embodied as a successive gaussian model in consideration of a shape of the beam spots 133.

The data embodied as a successive gaussian model is discretized at a proper discretization period or sampling period. When the discretization period is short, a time for compensation may be increased. Similarly, when the discretization period is long, an accuracy of compensation may be decreased. Therefore, a proper period (distance) is set up in advance.

The compensating mask generator 42 accrues intensity of the spot beams 133 discretized with respect to all fields of the projection optical system 140. Thereafter, a digital compensation with respect to the accrued intensity of the spot beams 133 is performed. A method of performing the digital compensation with respect to the accrued intensity of the spot beams 133 will be described with reference to FIGS. 7 and 8.

An exposure data of the light modulation element 130 is generated according to the exposure pattern in the exposure data generator 44. The exposure data generator 44 generates exposure on/off data. The exposure on/off data may convert (e.g. change) a portion of micro-mirror rows of the light modulation element 130 to off state. In addition, the exposure on/off data may convert a portion of rows of the micro lens array 146 to off state.

The controller 46 performs a logic AND operation of the compensating mask and the exposure on/off data to form an exposure pattern corrected by the compensating mask. The exposure pattern corrected by the compensating mask is transferred to the light modulation element 130.

Figure 7:
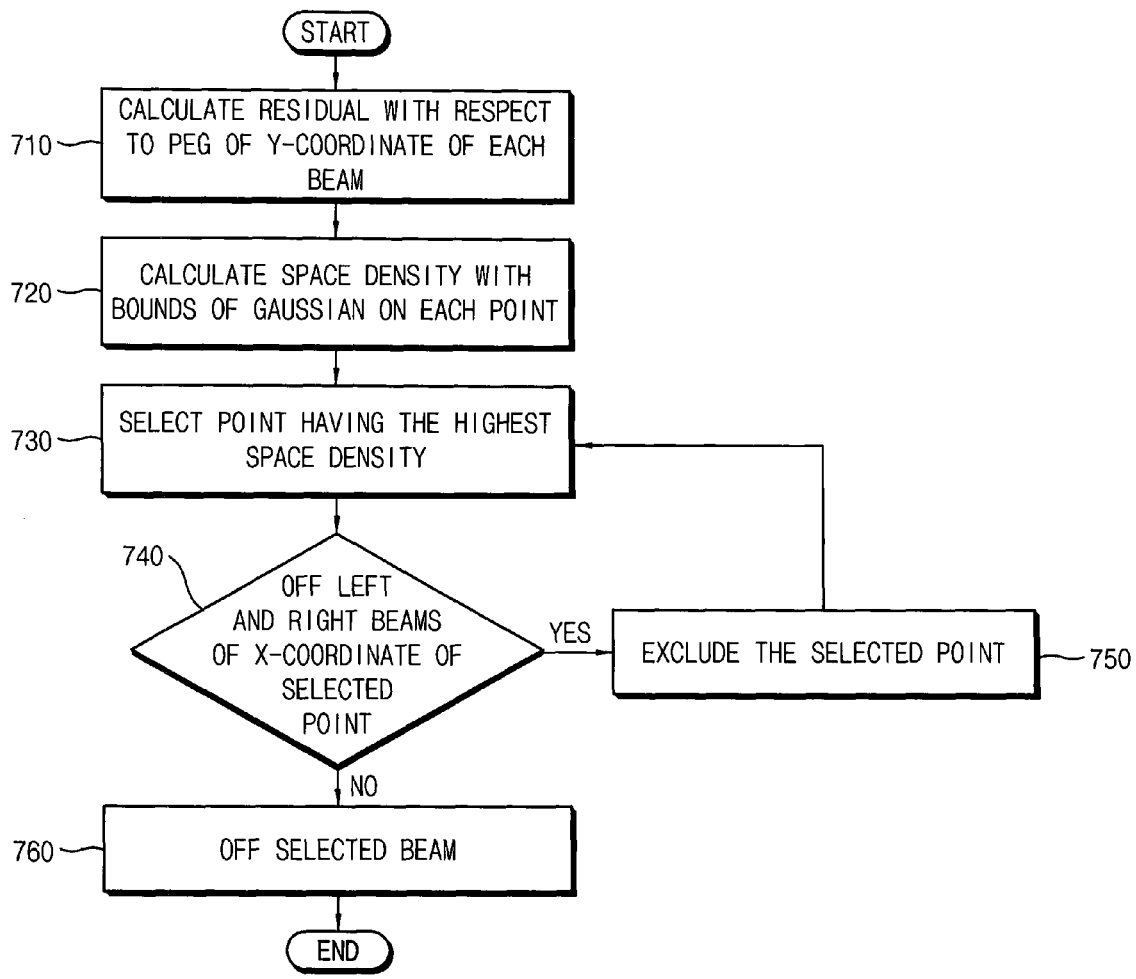
FIG. 7 is a flow chart illustrating a control method for compensating cumulative illumination using a maskless exposure device, according to an exemplary embodiment of the present inventive concept.
Figure 8:
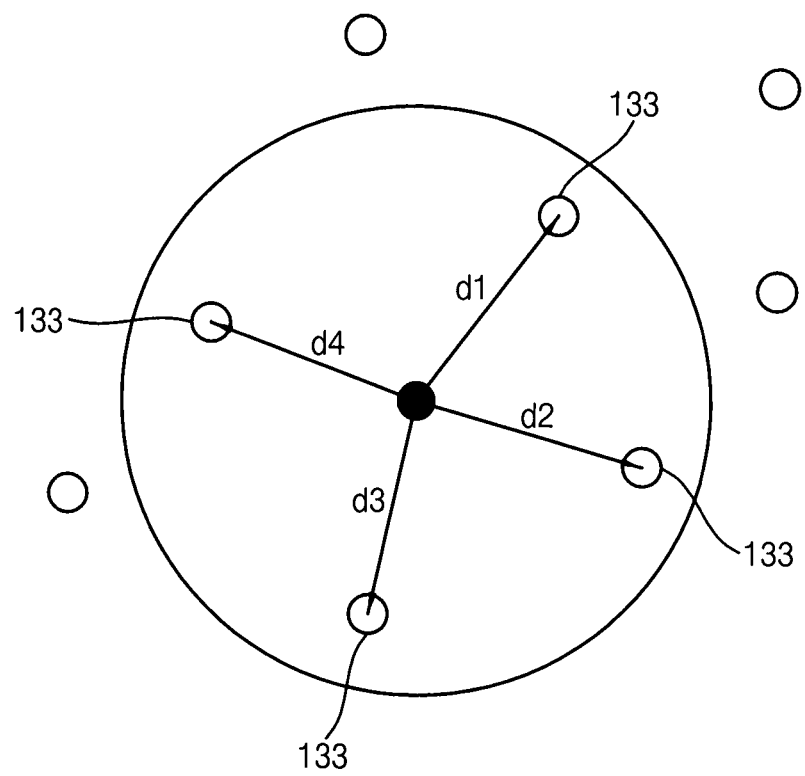
FIG. 8 is a conceptual diagram illustrating a method of calculating a space density for compensating cumulative illumination using a maskless exposure device, according to an exemplary embodiment of the present inventive concept.

FIG. 7 is a flow chart illustrating a control method for compensating cumulative illumination using a maskless exposure device according to an exemplary embodiment of the present inventive concept. FIG. 8 is a conceptual diagram for calculating a space density for compensating cumulative illumination using a maskless exposure device according to an exemplary embodiment of the present inventive concept.

Referring to FIGS. 7 and 8, a residual with respect to a PEG (e.g., output of a position event generator) of the y-coordinate of beam spots 133 is calculated (block 710). The residual may be defined by the following Equation 1.

$$\text{Residual} = \text{mod}(y\text{-coordinate of beam spots, PEG}) \qquad \text{Equation 1:}$$

For example, when the y-coordinate of beam spots 133 is 76.1 μm and the PEG is 1.0 μm, the residual is 0.1 (i.e., Residual=mod (76.1, 1.0)=0.1)

Further, space density in a gaussian range of each point of the beam spots 133 is calculated (block 720). The space density may be defined by the following Equation 2.

$$\frac{1}{d1^2 + d2^2 + d3^2 + d4^2} \qquad \text{Equation 2}$$

As shown in FIG. 8, a circled area based on a beam spot, which is marked as a black point, is an effective influential sphere of the gaussian range.

The space density is calculated by using a distance from the beam spot marked as a black point to other beam spots within the gaussian range (e.g., d1, d2, d3, and d4 as shown in Equation 2). Thus, the space density in a gaussian range of each point of the beam spots 133 is calculated. In other embodiments, more or fewer distances may be considered in Equation 2 as more than or less than four beam spots may fall within an effective influential sphere of a gaussian range of a particular beam spot.

Thereafter, a first selected spot beam is selected as a point having the highest space density (block 730).

After the first selected spot beam is selected, left and right beams of a first selected spot beam are turned off.

After the left and right beams of a first selected spot beam are off, the first selected spot beam is excluded from further selection targets (block 750). Thereafter, a second selected spot beam is selected (block 730) as a point having the second highest space density (e.g., the highest space density except for the first selected spot beam). At this time, if left and right beams of the second selected spot beam are not off, the second selected spot beam is turned off (blocks 740 and 760). Since beam spots of points having the highest space density are off, degradation of the LER may be prevented.

According to the present exemplary embodiment, the maskless exposure device compensates the cumulative illumination in software. Therefore, degradation of the LER may be prevented and the maskless exposure device may provide a regular (e.g., non-distorted) cumulative illumination.

It will be understood that, although the terms "first", "second", "third", etc., may be used herein to describe various spot beam, elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The maskless exposure device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the maskless exposure device may be formed on one integrated circuit (IC) chip or on separate IC chips. Further, the various components of the maskless exposure device may be implemented on a flexible printed circuit film, a tape carrier package (TCP), a printed circuit board (PCB), or formed on a same substrate. Further, the various components of the maskless exposure device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings of the present invention. Accordingly, all such modifications are intended to be included within the scope of the present invention as defined in the claims and equivalents thereof. In the claims, means-plus-function clauses are intended to cover the structures described herein as performing the recited function and also equivalent structures. The present inventive concept is defined by the following claims, with equivalents of the claims to be included therein.

What is claimed is:

1. A maskless exposure device comprising:
   a light source configured to emit an exposure beam;
   a light modulation element configured to modulate the exposure beam according to an exposure pattern;
   a projection optical system configured to transfer a modulated exposure beam to a substrate as a beam spot array;
   a beam measurement part configured to measure a beam data of the beam spot array; and
   a compensating mask generator configured to generate a compensating mask by utilizing a measured data of the exposure beam for compensating cumulative illumination,
   wherein the compensating mask generator is configured to select a first selected spot beam having the highest space density, to turn off left and right beams of the first selected spot beam selected by the beam data, and then to turn off a second selected spot beam.

2. The maskless exposure device of claim 1, wherein after left and right beams of the first selected spot beam are turned off, the first selected spot beam is excluded as selection targets.

3. The maskless exposure device of claim 1, wherein the beam data comprises data associated with position, intensity, horizontal size, and vertical size of spot beams constituting the beam spot array.

4. The maskless exposure device of claim 3, wherein the second selected spot beam is selected as a point having a second highest space density.

5. The maskless exposure device of claim 4, wherein a space density is defined by:

$$\frac{1}{d1^2 + d2^2 + d3^2 + d4^2},$$

and
   wherein each of the d1, d2, d3 and d4 represents a distance from a reference spot beam to another spot beam within a gaussian range of the reference spot beam.

6. The maskless exposure device of claim 3, wherein the compensating mask generator is further configured to accrue intensity of the spot beams discretized with respect to all fields of the projection optical system, and to perform a digital compensation with respect to the accrued intensity of the spot beams.

7. A maskless exposure device comprising:
   a light source configured to emit an exposure beam;
   a light modulation element configured to modulate the exposure beam according to an exposure pattern;
   a projection optical system configured to transfer a modulated exposure beam to a substrate as a beam spot array;
   a beam measurement part configured to measure a beam data of the beam spot array; and
   a compensating mask generator configured to generate a compensating mask by utilizing a measured data of the exposure beam for compensating cumulative illumination,
   wherein the compensating mask generator is configured to turn off left and right beams of a first selected spot beam selected by the beam data, and then to turn off a second selected spot beam,
   wherein the beam data comprises data associated with position, intensity, horizontal size, and vertical size of spot beams constituting the beam spot array, and
   wherein the compensating mask generator is configured to generate a compensating mask by calculating a residual with respect to a position event generator (PEG) of Y-coordinate of the spot beams.

8. The maskless exposure device of claim 1, further comprising:
a controller configured to transmit a corrected exposure pattern corrected by the compensating mask to the light modulation element.

9. The maskless exposure device of claim 8, further comprising:
an exposure data generator configured to generate exposure data of the light modulation element according to the exposure pattern.

10. The maskless exposure device of claim 9, wherein the controller is further configured to perform a logic AND operation of the compensating mask and the exposure data to form the corrected exposure pattern corrected by the compensating mask.

11. A method for compensating cumulative illumination utilizing a maskless exposure device, the method comprising:
transmitting light from a light source to a substrate through a light modulation element and a projection optical system as a beam spot array;
measuring beam data of the beam spot array; and
generating a compensating mask based on the measured beam data by selecting a first selected spot beam having a highest space density based on the beam data, turning off left and right beams of the first selected spot beam, and then turning off a second selected spot beam.

12. The method of claim 11, wherein the generating the compensating mask further comprises excluding the first selected spot beam after the left and right beams of the first selected spot beam are turned off.

13. The method of claim 11, wherein the beam data comprises data associated with position, intensity, horizontal size, and vertical size of each of the spot beams constituting the beam spot array.

14. The method of claim 13, the second selected spot beam is selected as a point having a second highest space density.

15. The method of claim 14, wherein a space density is defined by:

$$\frac{1}{d1^2 + d2^2 + d3^2 + d4^2},$$

and
wherein each of the d1, d2, d3 and d4 represents a distance from a reference spot beam to another spot beam within a gaussian range of the reference spot beam.

16. The method of claim 13, wherein the generating the compensating mask further comprises accruing intensity of the spot beams discretized with respect to all fields of the projection optical system, and performing a digital compensation with respect to the accrued intensity of the spot beams.

17. The method of claim 13, wherein the generating the compensating mask further comprises calculating a residual with respect to a position event generator output of Y-coordinate of the spot beams.

18. The method of claim 11, further comprising:
transmitting a corrected exposure pattern corrected by the compensating mask to the light modulation element.

19. The method of claim 18, further comprising:
generating exposure data of the light modulation element according to the exposure pattern.

20. The method of claim 19, further comprising:
performing a logic AND operation of the compensating mask and the exposure data to form the corrected exposure pattern corrected by the compensating mask.

* * * * *